United States Patent [19]
Frantz

[11] Patent Number: 5,066,929
[45] Date of Patent: Nov. 19, 1991

[54] CIRCUIT FOR PRODUCING FOUR INDICATIONS ON A BICOLOR LIGHT EMITTING DIODE HAVING TWO LEADS

[76] Inventor: Keith R. Frantz, 6 Bungalow St., Richland, Pa. 17087

[21] Appl. No.: 636,669

[22] Filed: Jan. 2, 1991

[51] Int. Cl.⁵ .................... H03K 3/03; G08B 5/36
[52] U.S. Cl. .................................. 331/57; 315/97; 315/251; 315/271; 331/75; 331/DIG. 3; 340/815.03; 340/815.1
[58] Field of Search ............. 331/57, DIG. 3, 74, 331/75; 340/815.03, 815.1; 315/167, 251, 271, 169.1, 97, 105

[56] References Cited

U.S. PATENT DOCUMENTS 4,038,611  7/1977  Greig ........................... 331/108 D

OTHER PUBLICATIONS

Martin, "Three-Color Signals with One Lamp", Model Railroader, Dec. 1974, p. 78.
Dunavin, "Tricolor LED Signal Circuit", Model Railroader (Symposium on Electronics, Nov. 1981, pp. 103, 104.
Mitchell, "Searchlight Signal in HO Scale (Almost)", Model Railroader (Symposium on Electronics), Feb. 1984, pp. 97, 98.
Trost, "Vier Farben mit Zweifarben-LED", Funkschan (Germany) Jan. 1982, p. 83.

*Primary Examiner*—Siegfried H. Grimm

[57] ABSTRACT

A circuit for producing four indications on a bicolor light emitting diode (LED) includes a ring oscillator, with two inputs controlling inverters of opposite phase. By enabling or disabling these inverters, either, both, or neither dies of the LED are energized, causing it to emit light of either of its two primary colors, a secondary color formed by the combination of its two primaries, or no light, respectively. Nonlinear resistances are used to equalize the brightness of the two primaries and set the hue of the secondary.

4 Claims, 2 Drawing Sheets

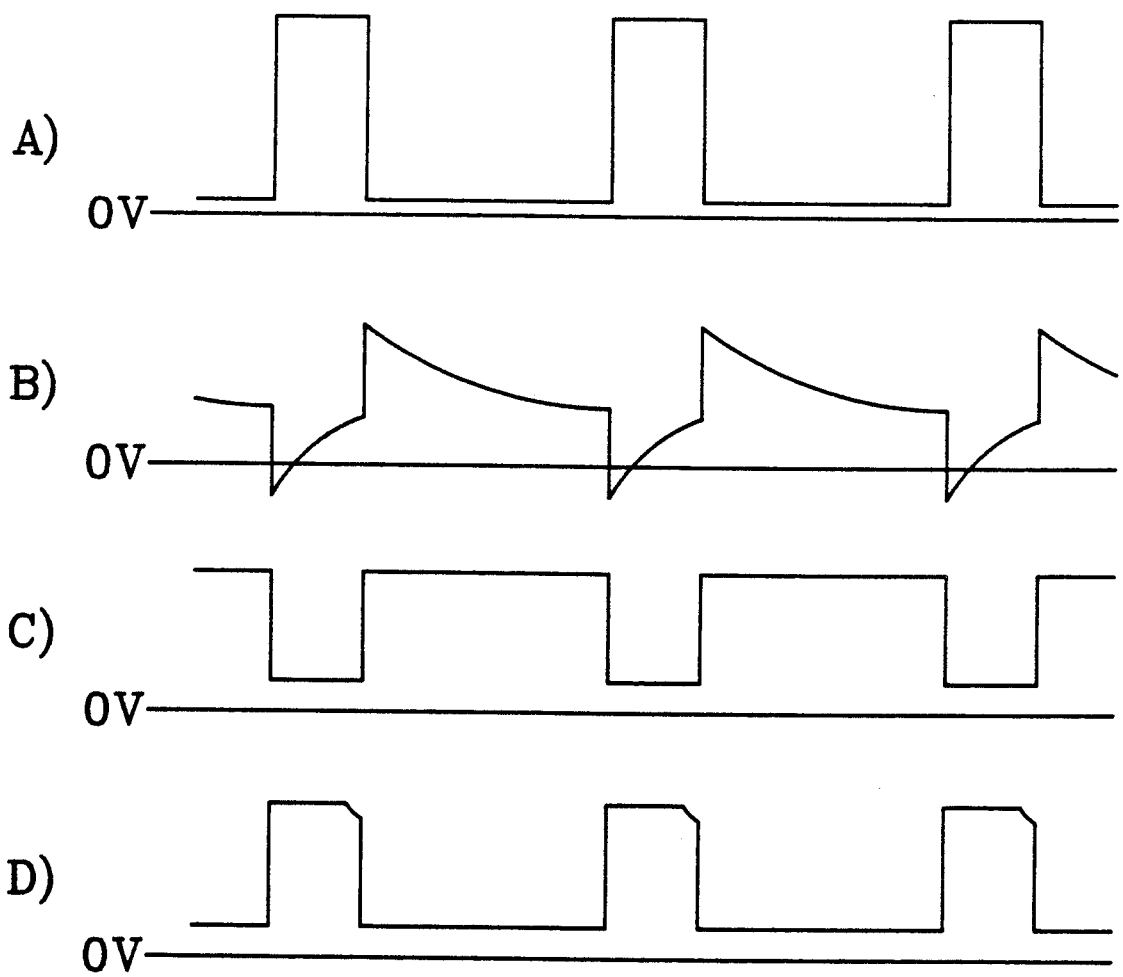

CIRCUIT FOR PRODUCING FOUR INDICATIONS ON A BICOLOR LIGHT EMITTING DIODE HAVING TWO LEADS

SUMMARY

A bicolor light emitting diode (LED) with two leads is capable of displaying only one of its two primary colors at once. The two dies are connected anode to cathode in parallel, and thus the voltage required across the device to energize one will reverse-bias the other, turning it off. If however an AC voltage is imposed across the device at a frequency higher than the critical fusion frequency of the eye, it will appear that both dies are on at once, allowing the device to display any secondary color between its two primaries (yellows and oranges in the case of red and green primaries). This circuit includes a ring oscillator, consisting of an odd number of inverting gates, to generate the high frequency AC, with the LED connected across two outputs of opposite phases. A plurality of the inverters are such that they have a second "control" input which can force the output to a given state regardless of the state of the first input (e.g. a two input NAND or NOR gate). By applying various combinations of logic levels to the two "control" inputs, it is possible to impose a positive, negative, AC, or no voltage across the LED. This will energize either, both, or neither of the LED's dies, producing either primary color, a secondary color, or turning the LED off, respectively. A nonlinear resistance is placed in series with the LED to equalize the brightness of two primaries, and a second nonlinear resistance is used in the oscillator's RC timing elements to set the hue of the secondary color by modifying its duty cycle. Either or both of these nonlinear resistances may be made adjustable to compensate for device to device variations. The inventive circuit is superior to prior art in that it integrates the generation of the AC voltage with the switching means required to realize four different states of the LED, and does so with a set of active devices available in a single, common integrated circuit.

REFERENCES

U.S. Pat. No. 4,038,611 7/26/1977 Greig
Martin, Eugene S. "Three-Color Signals with One Lamp", Model Railroader, December 1974, p. 78.
Dunavin, Timothy E. "Tricolor LED Signal Circuit", Model Railroader Symposium on Electronics, November 1981, pp. 103, 104
Mitchell, Don "Searchlight Signal in HO Scale (Almost)", Model Railroader Symposium on Electronics, February 1984, pp. 97, 98

BRIEF DESCRIPTION OF THE DRAWINGS

FIG. 2 shows in A to D waveforms showing the operation of the circuit in FIG. 1.

DETAILED DESCRIPTION

Figure 1:
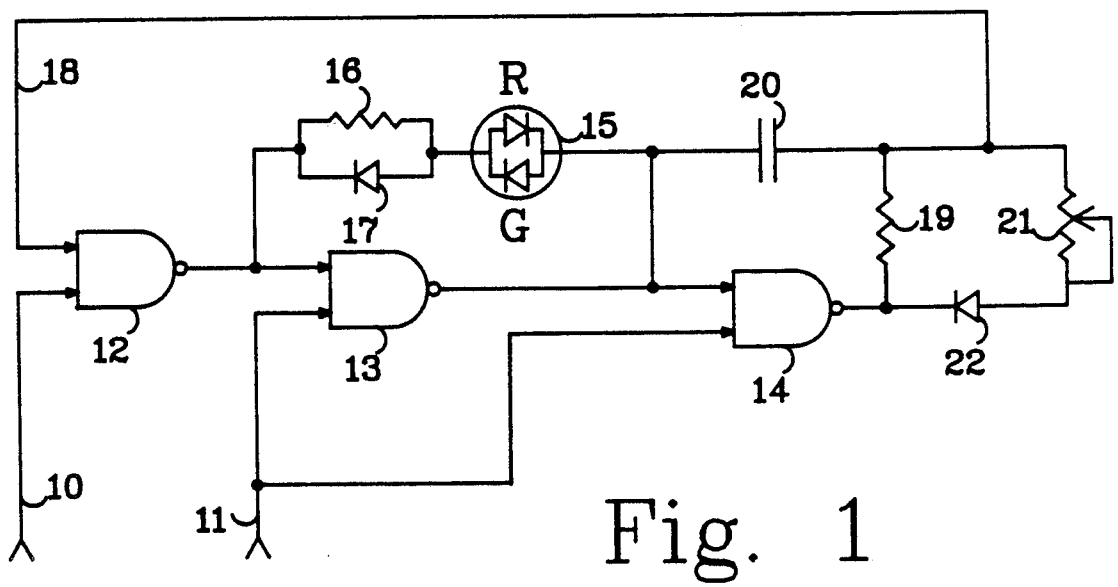
FIG. 1 is a schematic of the present invention.

Referring to the circuit in FIG. 1, there are four possible combinations of inputs that may be applied to the inputs 10 and 11. If both are low (i.e. false or logic 0), the outputs of NAND gates 12, 13, and 14 will be forced high (i.e. true or logic 1), regardless of the state of their other inputs. This is because the definition of a NAND gate's function is that its output is false if and only if all its inputs are true. Since the outputs of both gates 12 and 13 are high, there is no net voltage impressed across bicolor LED 15 or its series nonlinear resistance, formed by the parallel combination of resistor 16 and diode 17. Thus no current flows through the LED and it is dark.

If input 10 is raised to a high state, gate 12 becomes an inverter with respect to its other input 18. If input 11 is held low the output of gate 14 is still forced high, and since this is connected through resistor 19 to the input 18 of gate 12, gate 12's output is forced to a low level, both its input being high. Thus there is a positive voltage impressed across the green die of the LED from anode to cathode. This causes current to flow through the green die, as well as through resistor 16 and diode 17, and the LED illuminates green.

If input 11 is raised to a high state, gates 13 and 14 become inverters with respect to their other inputs. If input 10 is held low, thereby driving gate 12's output high, gate 13's output will be forced low. This impresses a positive voltage across the red die from anode to cathode, and current flows through the red die and also through resistor 16. However, since diode 17 is reverse-biased, current does not flow through it as in the paragraph above. Thus the current through LED 15 is reduced. This serves to equalize the brightness of red and green, since red is typically the more efficient die. If the green die were the more efficient, the polarity of diode 17 would be reversed.

If both inputs 10 and 11 are high, the circuit does not assume a stable state, but oscillates, since gates 12, 13, and 14 are all inverters in this case. FIGS. 2A to 2D illustrate voltage waveforms produced during this oscillation. FIG. 2A shows the output of gate 14, FIG. 2B the input 19 of gate 12, FIG. 2C the output of gate 12, and FIG. 2D the output of gate 14. Capacitor 20 has the effect of temporarily shorting out the inversion of gate 14 until it can be charged up to the switching threshold of gate 12 by resistor 19. This determines the duration of the low portion of the waveform in FIG. 2A. In the other portion, resistor 21 and diode 22 also help resistor 19 discharge C20, producing a shorter time constant. By thus modifying the relative on times of the two primary colors, the hue of the secondary (yellow or orange) produced by their combination is altered.

What is claimed is:

1. A circuit for producing four indications on a bicolor light emitting diode having two leads comprising:
   a plurality of inversion means connected in cascade to form an oscillator, having one or more additional inputs capable of forcing the output to a given state regardless of the state of the other inputs, the light emitting diode being connected between outputs of two said inversion means;
   a current modifying means for reducing the amplitude of the current in one direction through said light emitting diode relative to the current in the other direction; and
   a duty cycle adjustment means for controlling the relative durations of the current flow through said light emitting diode in one direction relative to the other.

2. The circuit of claim 1, where said inversion means are NAND or NOR gates.

3. The circuit of claim 1, where said current modifying means is a nonlinear resistance network in series with the light emitting diode, comprising a series combination of a diode and a resistor, said combination connected in parallel with another resistor, said resistors being either fixed or variable.

4. The circuit of claim 1, where said duty cycle adjustment means is a resistance-capacitance network, comprising:
   a nonlinear resistance connected between the output of one of said inversion means and the input of the next inversion means, comprising a series combination of a diode and a resistor, said combination connected in parallel with another resistor, said resistors being either fixed or variable; and
   a capacitor connected from the junction of the output of sad inversion means and said nonlinear resistance, to the input of the same inversion means.

* * * * *